(12) United States Patent
Sasaki et al.

(10) Patent No.: US 6,624,506 B2
(45) Date of Patent: Sep. 23, 2003

(54) MULTICHIP SEMICONDUCTOR DEVICE AND MEMORY CARD

(75) Inventors: Keiichi Sasaki, Yokohama (JP); Koji Sakui, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 98 days.

(21) Appl. No.: 09/837,262

(22) Filed: Apr. 19, 2001

(65) Prior Publication Data

US 2001/0045645 A1 Nov. 29, 2001

(30) Foreign Application Priority Data

Apr. 20, 2000 (JP) ........................................ 2000-119981

(51) Int. Cl.$^7$ .............................................. H01L 23/48
(52) U.S. Cl. ...................... 257/686; 257/723; 257/738; 361/790
(58) Field of Search ................................ 257/685, 686, 257/723, 737, 738, 774, 777, 778, 209, 529, 530, 922; 361/778, 805, 790, 803, 738; 438/467, 600, 601, 131, 132

(56) References Cited

U.S. PATENT DOCUMENTS

| | | | |
|---|---|---|---|
| 4,727,410 A | | 2/1988 | Higgins, III |
| 5,089,880 A | * | 2/1992 | Meyer et al. ................ 357/75 |
| 5,399,898 A | * | 3/1995 | Rostoker .................... 257/499 |
| 5,502,333 A | | 3/1996 | Bertin et al. |
| 5,798,282 A | | 8/1998 | Bertin et al. |
| 5,995,379 A | * | 11/1999 | Kyougoku et al. ......... 361/803 |
| 6,057,231 A | * | 5/2000 | Givens et al. .............. 438/644 |
| 6,087,719 A | * | 7/2000 | Tsunashima ................ 257/686 |
| 6,235,624 B1 | * | 5/2001 | Sasaki et al. ................ 438/618 |
| 6,239,495 B1 | * | 5/2001 | Sakui et al. ................. 257/777 |
| 6,376,904 B1 | * | 4/2002 | Haba et al. ................. 257/686 |
| 6,376,908 B1 | * | 4/2002 | Gaku et al. ................. 257/707 |
| 6,384,449 B2 | * | 5/2002 | Lee et al. .................... 257/315 |

FOREIGN PATENT DOCUMENTS

KR 222337 10/1999

OTHER PUBLICATIONS

Koji Sakui et al.; "Multichip Semiconductor Device and Memory Card" U.S. patent application No. 09/363,031, filed on Jul. 29, 1999.

Keiichi Sasaki et al.; "Paste, Connection Plug, Burying Method, and Semiconductor Device Manufacturing Method" U.S. patent application No. 09/321,534, filed on May 28, 1999.

Nobuo Hayasaka et al.; "Multichip Semiconductor Device, Chip Therefor and Method of Formation Thereof" U.S. patent application No. 08/980,873, filed on Dec. 1, 1997.

Nobuo Hayasaka et al.; "Multichip Semiconductor Device, Chip Therefor and Method of Formation Thereof" U.S. patent application No. 09/377,486, filed on Aug. 20, 1999.

* cited by examiner

*Primary Examiner*—Kamand Cuneo
*Assistant Examiner*—Lourdes Cruz
(74) *Attorney, Agent, or Firm*—Finnegan, Henderson, Farabow, Garrett & Dunner, L.L.P.

(57) ABSTRACT

A plurality of semiconductor chips with the same structure are stacked to construct a multichip semiconductor device. In each of the semiconductor chips, an optional circuit is formed. In the optional circuit, fuses corresponding to the stacked-stage number of each chip are formed and the fuses are selectively cut off so as to permit each chip to individually receive a chip control signal.

25 Claims, 7 Drawing Sheets

MULTICHIP SEMICONDUCTOR DEVICE AND MEMORY CARD

CROSS-REFERENCE TO RELATED APPLICATIONS

This application is based upon and claims the benefit of priority from the prior Japanese Patent Application No. 2000-119981, filed Apr. 20, 2000, the entire contents of which are incorporated herein by reference.

BACKGROUND OF THE INVENTION

This invention relates to a multichip semiconductor memory device and memory card and more particularly to a multichip semiconductor device and memory card on which a plurality of semiconductor chips or a plurality of semiconductor chips having semiconductor memories and logic circuits formed therein are mounted in a stacked form.

Recently, memory cards are widely used as film media of digital cameras and storage devices of mobile personal computers. For example, as the memory card, an SSFDC (Solid-State Floppy Disk Card) having a NAND-type $E^2$PROM which is a nonvolatile memory mounted thereon or a so-called "Smart Media" is known. At present, large-capacity memory cards each having one or two 64-Mbit NAND-type $E^2$PROMs mounted thereon are commercially available. However, recently, a new market for multimedia or the like has opened up, a demand for larger-capacity memory elements has arisen and it is strongly desired to realize a larger memory capacity.

As one technique for realizing a large-capacity memory device, a technique for forming semiconductor chips each having connection plugs which are called chip through plugs and provided in through holes formed to penetrate through the semiconductor substrate and forming a multichip semiconductor device by mounting a plurality of semiconductor chips in a stacked form is known. Various control signals and data items are supplied to the plurality of stacked semiconductor chips from the mounting board via the chip through plugs or data items are read out therefrom. However, the technique has inherent problems that need to be solved.

For example, in the conventional on-plane-board mounting technique, it is possible to distribute four chip control signals (chip enable bars) when a memory device is constructed by use of four semiconductor memory chips with the same structure. However, if the semiconductor chips are stacked in order to reduce the mounting area, it becomes necessary to divide the chip control signal inside the respective chips. This means that four different types of chips are manufactured and is not advisable when taking the manufacturing cost into consideration.

Before the present invention is made, one of the inventors hereof and three other persons proposed a multichip semiconductor device that comprises a plurality of semiconductor chips each having elements integrated in the semiconductor substrate, as is disclosed in Japanese Patent Application No. 10-213880 (corresponding U.S. patent application Ser. No. 09/363,031 which matured into a patent on Jan. 17, 2001). The multichip semiconductor device is formed by stacking a plurality of semiconductor chips of substantially the same structure, each having connection plugs in through holes made in the semiconductor substrate. In each semiconductor chip, bumps connect some of the connection plugs. Each semiconductor chip has optional circuits, at least one of which is selected in accordance with which connection plugs are connected by the bumps.

According to the multichip semiconductor device with the above construction, it is possible to individually supply chip control signals to the chips even if the chips with the same structure are used by respectively forming the optional circuits in the plurality of chips and selectively forming the bumps used for connection with the plugs for the respective chips.

However, when the above method is used, it is required to selectively connect the bumps to the plugs, and if the bumps are formed by use of a solder-plating method, it is required to form a mask for each chip. Further, if the bumps are simultaneously formed for each chip as in a transfer bump method, the setting position of the bumps must be changed for each stacked stage of the chip, and therefore, it is required to replace the mask at the time of formation of the bumps or it is required to provide devices for the respective stacked stages. In a case where bumps are simultaneously formed on each wafer, for example, where bumps are formed by plating on the wafer, it is required to form bumps in different positions for each stacked stage and the compatibility of the respective stacked layers is not allowed.

Thus, the technique disclosed in the prior application can individually supply chip control signals and lower the manufacturing cost even if the chips with the same structure are stacked, but it can be still improved in the respect that the production efficiency is further enhanced and the manufacturing cost is further lowered.

As described above, in the conventional multichip semiconductor device and memory card, it is possible to individually supply chip control signals and lower the manufacturing cost even if the chips with the same structure are stacked, but they are still improved in the respect that the production efficiency is further enhanced and the manufacturing cost is further lowered.

BRIEF SUMMARY OF THE INVENTION

According to an aspect of the present invention, there is provided a multichip semiconductor device having a plurality of semiconductor chips, each of the plurality of semiconductor chips comprising a semiconductor substrate having elements integrated therein, connection plugs formed in through holes formed to penetrate through the semiconductor substrate, and fuse portions provided between connection plugs and corresponding bumps, wherein the plurality of semiconductor chips are stacked and mounted by connecting the connection plugs of the respective semiconductor chips via the bumps.

According to another aspect of the present invention, there is provided a memory card comprising a plurality of semiconductor memory chips with substantially the same structure, each including connection plugs formed in through holes formed to penetrate through a semiconductor substrate, and fuse portions respectively provided between the connection plugs and corresponding bump forming areas and being selectively cut off for specifying assignment of an address, bumps formed in substantially the same pattern, for connecting the connection plugs of the semiconductor memory chips, a card-form package for sealing the plurality of semiconductor memory chips in a stacked form, and terminals provided in the card-form package, for transferring signals with respect to the semiconductor memory chips via the connection plugs, fuse portions and bumps.

According to still another aspect of the present invention, there is provided multichip semiconductor device having a plurality of semiconductor chips stacked one upon another, each of which comprises a semiconductor substrate having elements integrated therein, a chip through plug provided in the semiconductor substrate, for receiving a chip address, and a chip-identifying circuit provided in the semiconductor substrate, for receiving the chip address from the chip through plug and determining from the chip address how many other chips are located below the semiconductor chip, wherein the chip identifying circuit of each semiconductor chip processes the chip address and then outputs the chip address to the chip-through plug of the immediately upper chip.

DETAILED DESCRIPTION OF THE INVENTION

This invention is made based on the premise of the technique disclosed in Jpn. Pat. Appln. No. H10-213880 (corresponding U.S. patent application Ser. No. 09/363,031 which was allowed on Jan. 17, 2001) by the inventors of this application and attained by improving the above technique.

First Embodiment

Figure 1:
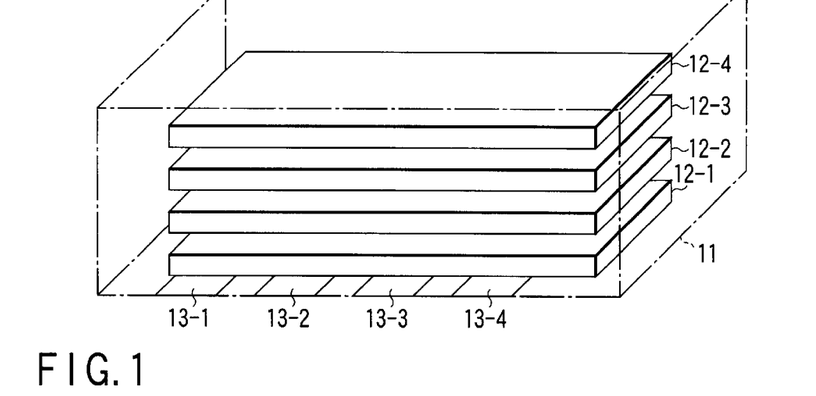
FIG. 1 is a perspective view schematically showing the internal structure of the card-form package of an SSFDC (memory card), for illustrating a multichip semiconductor device and memory card according to a first embodiment of this invention.
Figure 2:
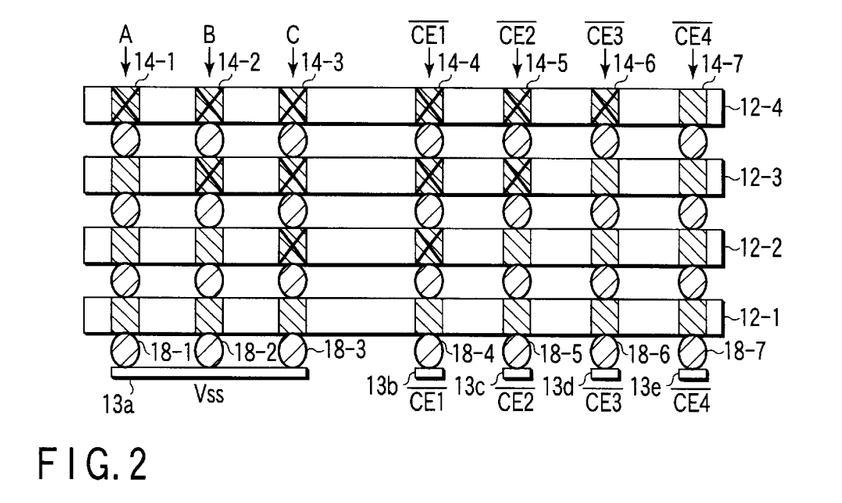
FIG. 2 is a cross sectional view schematically showing a connection pattern after fuses for selectively connecting semiconductor memory chips in the SSFDC shown in FIG. 1 are cut off, for illustrating the multichip semiconductor device and memory card according to the first embodiment of this invention.
Figure 3:
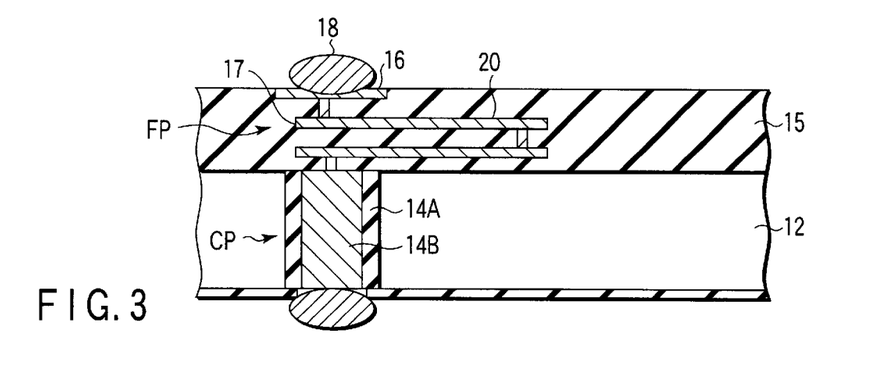
FIG. 3 is a cross sectional view showing an enlarged portion of a connection plug and fuse portion of each semiconductor memory chip shown in FIGS. 1 and 2, for illustrating the multichip semiconductor device and memory card according to the first embodiment of this invention.
Figure 4:
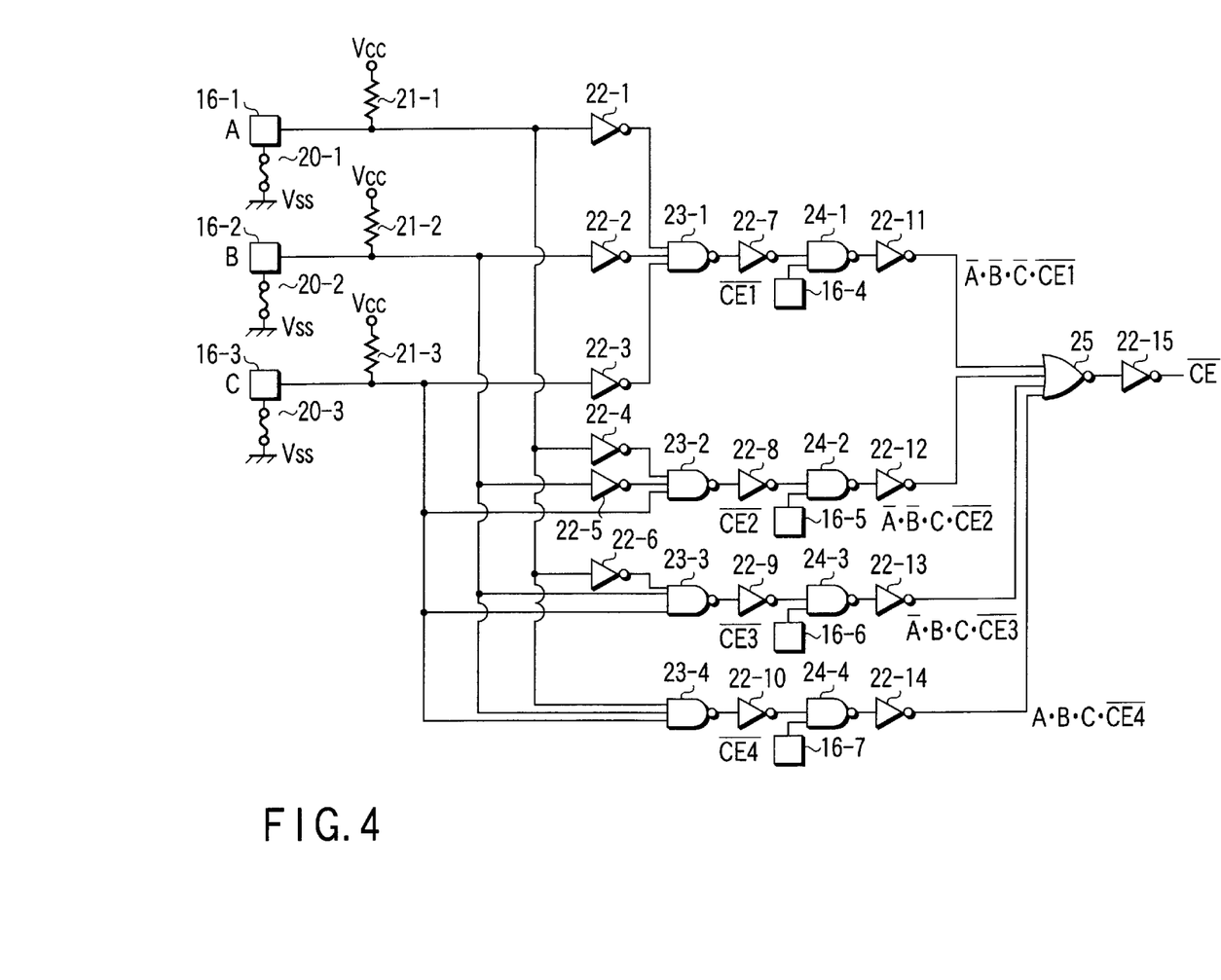
FIG. 4 is a circuit diagram showing a concrete circuit construction of part of each semiconductor memory chip shown in FIGS. 1 and 2 and associated with the fuse portion shown in FIG. 3, for illustrating the multichip semiconductor device and memory card according to the first embodiment of this invention.

FIGS. 1 to 4 illustrate a multichip semiconductor device and memory card according to a first embodiment of this invention, FIG. 1 is a perspective view schematically showing the internal structure of the card-form package of an SSFDC (memory card), FIG. 2 is a cross sectional view schematically showing a connection pattern after fuses for selectively connecting semiconductor memory chips in the SSFDC shown in FIG. 1 are cut off, FIG. 3 is a cross sectional view showing an enlarged portion of a connection plug and fuse portion of each semiconductor memory chip shown in FIGS. 1 and 2, and FIG. 4 is a circuit diagram showing a concrete circuit construction of part of each semiconductor memory chip shown in FIGS. 1 and 2 and associated with the fuse portion shown in FIG. 3.

As shown in FIG. 1, the SSFDC (Solid-State Floppy Disk Card) 11 has four semiconductor memory chips such as NAND-type $E^2$PROM chips 12-1 to 12-4 mounted thereon in a stacked form. Each of the chips 12-1 to 12-4 has the same structure. The power supply voltages of the NAND-type $E^2$PROMs, control signals, addresses, input data items and the like are input to the NAND-type $E^2$PROM chips 12-1 to 12-4 via respective surface terminals 13-1 to 13-4 (part of which is shown) of the SSFDC 11 and output data items are output to the exterior of the SSFDC 11.

As shown in FIG. 2, chip through plugs (connection plugs) 14-1 to 14-7 are formed in each of the chips 12-1 to 12-4 and the chip through plugs 14-1 to 14-7 formed in respective positions of the chips 12-1 to 12-4 are electrically and commonly connected between the adjacent chips via respective solder bumps 18-1 to 18-7. That is, the solder bumps 18-1 to 18-7 are formed in the same pattern on each of the chips 12-1 to 12-4.

Further, terminals (part of which is shown) 13a to 13e connected to the surface terminals 13-1 to 13-4 of the SSFDC 11 are supplied with a ground voltage Vss, first chip selection signal $\overline{CE1}$, second chip selection signal $\overline{CE2}$, third chip selection signal $\overline{CE3}$ and fourth chip selection signal $\overline{CE4}$.

As partly shown in FIG. 3, connection plugs CP and fuse portions FP are formed in each of the chips 12-1 to 12-4. The connection plug CP has an insulating film 14A formed on the side wall of the through hole of the chip (semiconductor substrate) 12 and a conductive through plug (chip through plug) 14B which is filled in the through hole and electrically isolated from the semiconductor substrate 12 by means of the insulating film 14A.

The fuse portion FP is formed in an insulating film 15 between the connection plug OP and a corresponding one of the solder bumps 18 and has a pad 16 on which the solder bump 18 is formed, a fuse 20, a wiring 17 for electrically connecting the pad 16 to the chip through plug 14 via the fuse 20 and the like. Whether the chip through plug 14 and solder bump 18 are electrically connected or not, that is, whether or not a signal is transmitted from the underlying chip to the chip lying on the upper layer among the stacked chips is determined according the whether the fuse 20 is cut off or not.

The fuse portion FP is formed in an insulating film between the connection plug CP and a corresponding one of the solder bumps 18 and has a pad 16 on which the solder bump 18 is formed, a fuse 20, a wiring 17 for electrically connecting the pad 16 to the chip through plug 14 via the fuse 20 and the like. Whether the chip through plug 14 and solder bump 18 are electrically connected or not, that is, whether or not a signal is transmitted from the underlying chip to the chip lying on the upper layer among the stacked chips is determined according to whether the fuse 20 is cut off or not.

In FIG. 2, chip through plugs in positions in each of which the electrical connection between the chip through plug 14 and the solder bump 18 is broken by the fuse cutoff are indicated by x marks and schematically shown. That is, the fuses 20 corresponding in position to $\overline{CE1}$ to $\overline{CE3}$ and signal terminals A, B, C are cut off in the chip 12-4, the fuses 20 corresponding in position to $\overline{CE1}$, $\overline{CE2}$ and signal terminals B, C are cut off in the chip 12-3, and the fuses 20 corresponding in position to $\overline{CE1}$ and signal terminal C are cut off in the chip 12-2.

As a result, the ground voltage Vss used as the signals A, B, C and $\overline{CE1}$, $\overline{CE2}$, $\overline{CE3}$, $\overline{CE4}$ used as chip selection signals are supplied to the semiconductor chip 12-1. The ground voltage Vss used as the signals A, B and $\overline{CE2}$, $\overline{CE3}$, $\overline{CE4}$ used as chip selection signals are supplied to the semiconductor chip 12-2. Further, the ground voltage Vss used as the signal A and $\overline{CE3}$, $\overline{CE4}$ used as chip selection signals are supplied to the semiconductor chip 12-3. In addition, none of the signals A, B, C are supplied and $\overline{CE4}$ used as a chip selection signal is supplied to the semiconductor chip 12-4.

The circuit shown in FIG. 4 is an optional circuit for detecting one of the semiconductor memory chips 12-1 to 12-4 which is selected based on the signals A, B, C, $\overline{CE1}$, $\overline{CE2}$, $\overline{CE3}$, $\overline{CE4}$ and activating the selected chip. For example, the optional circuit includes fuses 20-1 to 20-3 (corresponding to the fuse 20 shown in FIG. 3), resistors 21-1 to 21-3, inverter circuits 22-1 to 22-15, 3-input NAND circuits 23-1 to 23-4, 2-input NAND circuits 24-1 to 24-4 and 4-input NOR circuit 25 and is operated on a voltage between the power supply potential Vcc and the ground potential Vss.

The fuses 20-1, 20-2, 20-3 are provided between pads 16-1, 16-2, 16-3 (corresponding to the pads 16 lying on the chip through plugs 14-1, 14-2, 14-3 in FIG. 2) respectively supplied with the signals A, B, C and the ground potential Vss node. If the fuse is not cut off, the pad is applied with the ground potential Vss, and if the fuse is cut off, the pad is set in the electrically open state. The high resistance resistors 21-1, 21-2, 21-3 are respectively connected between the pads 16-1, 16-2, 16-3 and the power supply potential Vcc node. Further, the input terminals of the inverter circuits 22-1, 22-2, 22-3 are respectively connected to the pads 16-1, 16-2, 16-3 and the output terminals of the inverter circuits 22-1, 22-2, 22-3 are respectively connected to the input terminals of the NAND circuit 23-1. The input terminals of the inverter circuits 22-4, 22-5 are respectively connected to the pads 16-1, 16-2 and the output terminals of the inverter circuits 22-4, 22-5 and the pad 16-3 are respectively connected to the input terminals of the NAND circuit 23-2. The input terminal of the inverter circuit 22-6 is connected to the pad 16-1 and the output terminal of the inverter circuit 22-6 and the pads 16-2, 16-3 are respectively connected to the input terminals of the NAND circuit 23-3. Further, the pads 16-1, 16-2, 16-3 are respectively connected to the input terminals of the NAND circuit 23-4.

The input terminal of the inverter circuit 22-7 is connected to the output terminal of the NAND circuit 23-1 and the output terminal of the inverter circuit 22-7 is connected to one input terminal of the NAND circuit 24-1. The other input terminal of the NAND circuit 24-1 is connected to the pad 16-4 to which the chip selection signal $\overline{CE1}$ is input. The input terminal of the inverter circuit 22-8 is connected to the output terminal of the NAND circuit 23-2 and the output terminal of the inverter circuit 22-8 is connected to one input terminal of the NAND circuit 24-2. The other input terminal of the NAND circuit 24-2 is connected to the pad 16-5 to which the chip selection signal CE2 is input. Likewise, the input terminal of the inverter circuit 22-9 is connected to the output terminal of the NAND circuit 23-3 and the output terminal of the inverter circuit 22-9 is connected to one input terminal of the NAND circuit 24-3. The other input terminal of the NAND circuit 24-3 is connected to the pad 16-6 to which the chip selection signal $\overline{CE3}$ is input. Further, the input terminal of the inverter circuit 22-10 is connected to the output terminal of the NAND circuit 23-4 and the output terminal of the inverter circuit 22-10 is connected to one input terminal of the NAND circuit 24-4. The other input terminal of the NAND circuit 24-4 is connected to the pad 16-7 to which the chip selection signal $\overline{CE4}$ is input.

The input terminals of the inverter circuits 22-11 to 22-14 are respectively connected to the output terminals of the NAND circuits 24-1 to 24-4 and the output terminals of the inverter circuits 22-11 to 22-14 are connected to the respective input terminals of the NOR circuit 25. The output terminal of the NOR circuit 25 is connected to the input terminal of the inverter circuit 22-15 and a chip selection signal $\overline{CE}$ is derived from the output terminal of the inverter circuit 22-15.

In this case, the logical output of the inverter circuit 22-11 is $\overline{A} \cdot \overline{B} \cdot \overline{C} \cdot \overline{CE1}$, the logical output of the inverter circuit 22-12 is $\overline{A} \cdot \overline{B} \cdot C \cdot \overline{CE2}$ the logical output of the inverter circuit 22-13 is $\overline{A} \cdot B \cdot C \cdot \overline{CE3}$ and the logical output of the inverter circuit 22-14 is $A \cdot B \cdot C \cdot \overline{CE4}$.

It is preferable to use MOS transistors having a small channel width W and a large channel length L as the resistors 21-1 to 21-3. Alternatively, it is preferable to construct the resistors by serially connecting the current paths of a plurality of MOS transistors. The reason is that a through current constantly flowing from the power supply voltage Vcc node to the ground voltage Vss node can be suppressed when they are grounded via the solder bumps 18-1 to 18-3. For example, as each of the resistors 21-1 to 21-3, five P-channel MOS transistors whose current paths are serially connected and whose gates are grounded are used.

According to the circuit of FIG. 4, the chip in which none of the fuses 20-1, 20-2, 20-3 are cut off and the signals A, B, C are all set at the ground voltage vss, that is, the chip 12-1 in FIG. 2 is controlled by the first chip selection signal $\overline{CE1}$ and activated. Further, the chip in which none of the fuses 20-1, 20-2 are cut off, both of the signals A, B are set at the ground voltage Vss, the fuse 20-3 is cut off and the signal C is set at the power supply voltage Vcc, that is, the chip 12-2 in FIG. 2 is controlled by the second chip selection signal $\overline{CE2}$ and activated. The chip in which the fuse 20-1 is not cut off, the signal A is set at the ground voltage Vss, the fuses 20-2, 20-3 are cut off and both of the signals B, C are set at the power supply voltage Vcc, that is, the chip 12-3 in FIG. 2 is controlled by the third chip selection signal $\overline{CE3}$ and activated. Further, the chip in which the fuses 20-1, 20-2, 20-3 are cut off and the signals A, B, C are all set at the power supply voltage Vcc, that is, the chip 12-4 in FIG. 2 is controlled by the fourth chip selection signal $\overline{CE4}$ and activated. The operation is shown in the following Table 1.

TABLE 1

| A | B | C | $\overline{CE}$ | chip |
|---|---|---|---|---|
| Vss(0) | Vss(0) | Vss(0) | $\overline{CE1}$ | chip 12-1 |
| Vss(0) | Vss(0) | Vcc(1) | $\overline{CE2}$ | chip 12-2 |
| Vss(0) | Vcc(1) | Vcc(1) | $\overline{CE3}$ | chip 12-3 |
| Vcc(1) | Vcc(1) | Vcc(1) | $\overline{CE4}$ | chip 12-4 |

In Table 1, Vss(0) indicates a case wherein the fuses 20-1 to 20-3 are not cut off and at least one of the corresponding pads 16-1 to 16-3 is grounded. Further, Vcc(1) indicates a case wherein at least one of the fuses 20-1 to 20-3 is cut off and at least one of the pads 16-1 to 16-3 is biased by the power supply voltage vcc via a corresponding one of the high-resistance resistors 21-1 to 21-3. When all of the fuses 20-1 to 20-3 are cut off, the pads 16-1 to 16-3 are biased by the power supply voltage Vcc via the respective resistors 21-1 to 21-3. Therefore, the levels of the signals A, B, C can be set according to whether the fuse portions are cut off or not and the semiconductor chips 12-1 to 12-4 can be freely selected according to the cutoff state of the fuse portions.

If at least (n−1) chip through plugs are provided when the number of semiconductor memory chips to be stacked is n, chip addresses for the n semiconductor memory chips can be assigned.

With the above construction, since a plurality of semiconductor memory chips with the same structure are stacked and mounted on a card-form package, it is not necessary to form a plurality of different types of semiconductor memory chips with different structures, the same test can be performed for all of the semiconductor memory chips and it is not necessary to pay any attention to the order of the semiconductor memory chips to be stacked, and therefore, the manufacturing cost can be lowered.

Further, it is not necessary to selectively connect the bumps to the plugs and assignment of the chip addresses for a plurality of semiconductor memory chips can be specified according to the cutoff state of the fuse portions provided in the semiconductor memory chips to be stacked. In a case where bumps are formed by the solder-plating method, it is not necessary to form a mask for each chip. Further, in a case where bumps are simultaneously formed on each chip as in the transfer bump method, it is not necessary to replace a mask at the time of formation of bumps and it is not necessary to provide devices for the respective stacked stages. Further, in a case where bumps are simultaneously formed on each wafer, for example, in a case wherein bumps are formed on the wafer by plating, it is not necessary to form the bumps in different positions for the respective stacked stages. As a result, production efficiency can be enhanced and the manufacturing cost can be further lowered.

Further, since a plurality of semiconductor memory chips are mounted in a stacked form, the plane area of the card can be made small, and since a plurality of semiconductor memory chips are stacked with metal bumps such as solder bumps disposed therebetween, a thin memory card can be obtained.

Second Embodiment

The second embodiment is to perform a redundancy process by use of the whole portion of a plurality of stacked semiconductor memory chips. The redundancy technique for a multichip semiconductor device and memory card is explained with reference to FIGS. 5 to 9.

Figure 5:
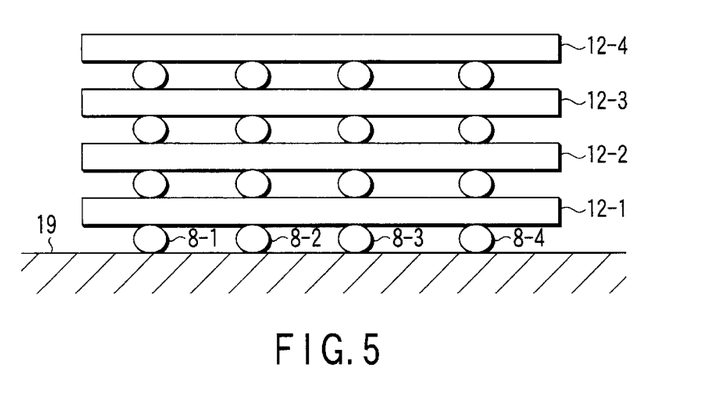
FIG. 5 is a side view showing the stacked state of a plurality of semiconductor chips, for illustrating a multichip semiconductor device and memory card according to a second embodiment of this invention.

First, a semiconductor memory chip formed is evaluated, and if a defective cell or defective block exists in the semiconductor memory chip, it is replaced by a spare cell or spare block by cutting off a redundancy fuse or the like to attain a constant memory capacity. Then, as is explained in the first embodiment, fuses provided between chip through plugs and solder bumps are selectively cut off according to the stacked-stage number of each of the chips 12-1 to 12-4 to form a connection pattern corresponding to the stacked-stage number. After this, as shown in FIG. 5, the semiconductor memory chips 12-1 to 12-4 with the same structure are mounted on a mounting board 19 in a stacked form with the solder bumps 8-1, 8-2, disposed therebetween.

Figure 6:
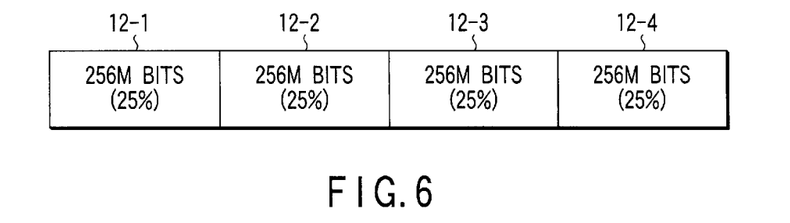
FIG. 6 is a schematic diagram showing an example in which assignment of the memory capacity to four semiconductor memory chips is the same.

In this case, generally, assignment of the memory capacity is equally made to the semiconductor memory chips 12-1 to 12-4 as shown in FIG. 6, and if each of the stacked semiconductor memory chips 12-1 to 12-4 has a memory capacity of 256 Mbits after the redundancy process, a memory having a capacity of 1 Gbit can be obtained after the stacking operation and each of the semiconductor memory chips 12-1 to 12-4 has a memory capacity which is 25% of the total memory capacity.

In the second embodiment, the chip evaluation process and fuse cutoff process are effected to compensate for the defective cell and defective block, assignment of the memory addresses for the four chips 12-1 to 12-4 is made while the assignment of the memory addresses is adjusted between the four chips to obtain a device with a memory of 1 Gbit.

Figure 7:
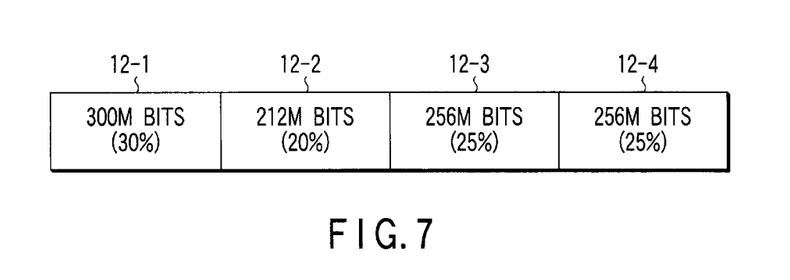
FIG. 7 is a schematic diagram showing an example in which assignment of the memory capacity is different between four semiconductor memory chips.

That is, as shown in FIG. 7, for example, if the operable memory capacity of the chip 12-1 is 300 Mbits, a circuit correction is made by a fuse-cutting method or the like so as to make all the memory cells operable and assign addresses to all of the memory cells. Thus, the memory capacity of chip 12-1 is approx. 30% of 1 Gbit. Further, if the operable memory capacity of the chip 12-2 is 212 Mbits, the memory capacity of the chip 12-2 which is approx. 20% of 1 Gbit can be used.

By processing the chips 12-3, 12-4 in the same manner as described above (in the case of FIG. 7, the memory capacity of each of the chips 12-3, 12-4 is 256 Mbits), the chip 12-2 which has an excessively large number of defective cells as one chip, which is normally discarded, can be utilized. Further, since memory cell blocks for redundancy can be commonly used for a plurality of chips, the number of memory cell blocks used for redundancy can be suppressed and a memory having a memory capacity of 1 Gbit or more can be realized by use of the four chips and by positively using the memory cell blocks for redundancy.

Figure 8:
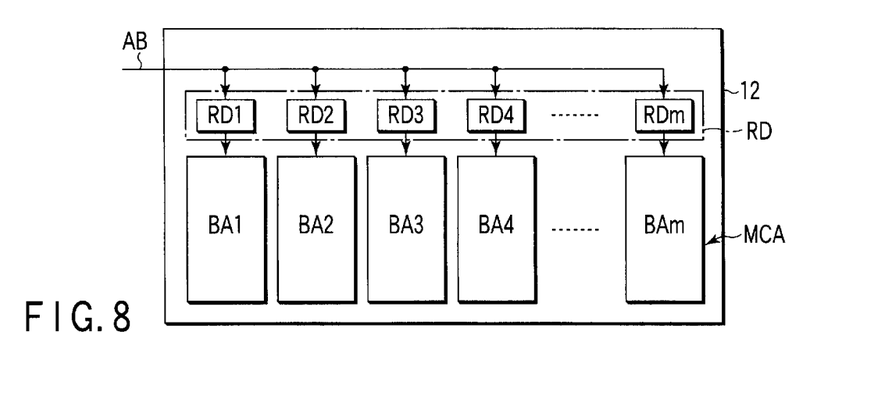
FIG. 8 is a block diagram showing an extracted main part of a memory cell section of the chip and the surrounding portion thereof, for specifically illustrating an example of the redundancy process effected for a plurality of chips.

Next, an example in which the redundancy process is performed by use of all of the four chips 12-1 to 12-4 is specifically explained with reference to FIGS. 8 and 9. As shown in FIG. 8, a memory cell array MCA and row decoder RD are provided in each of the chips 12, the memory cell array MCA includes m memory cell blocks BA1 to BAm and the row decoder RD has row decoder portions RD1 to Rdm provided corresponding to the memory cell blocks BA1 to BAm. A redundancy fuse is provided in each of the row decoder portions RD1 to RDm, and when a row address input via an address bus AB coincides with a fail address, a circuit correction is made by cutting off the fuse to set a corresponding memory cell block into a non-selective state and a redundancy memory block instead of the corresponding memory cell block is selected.

Figure 9:
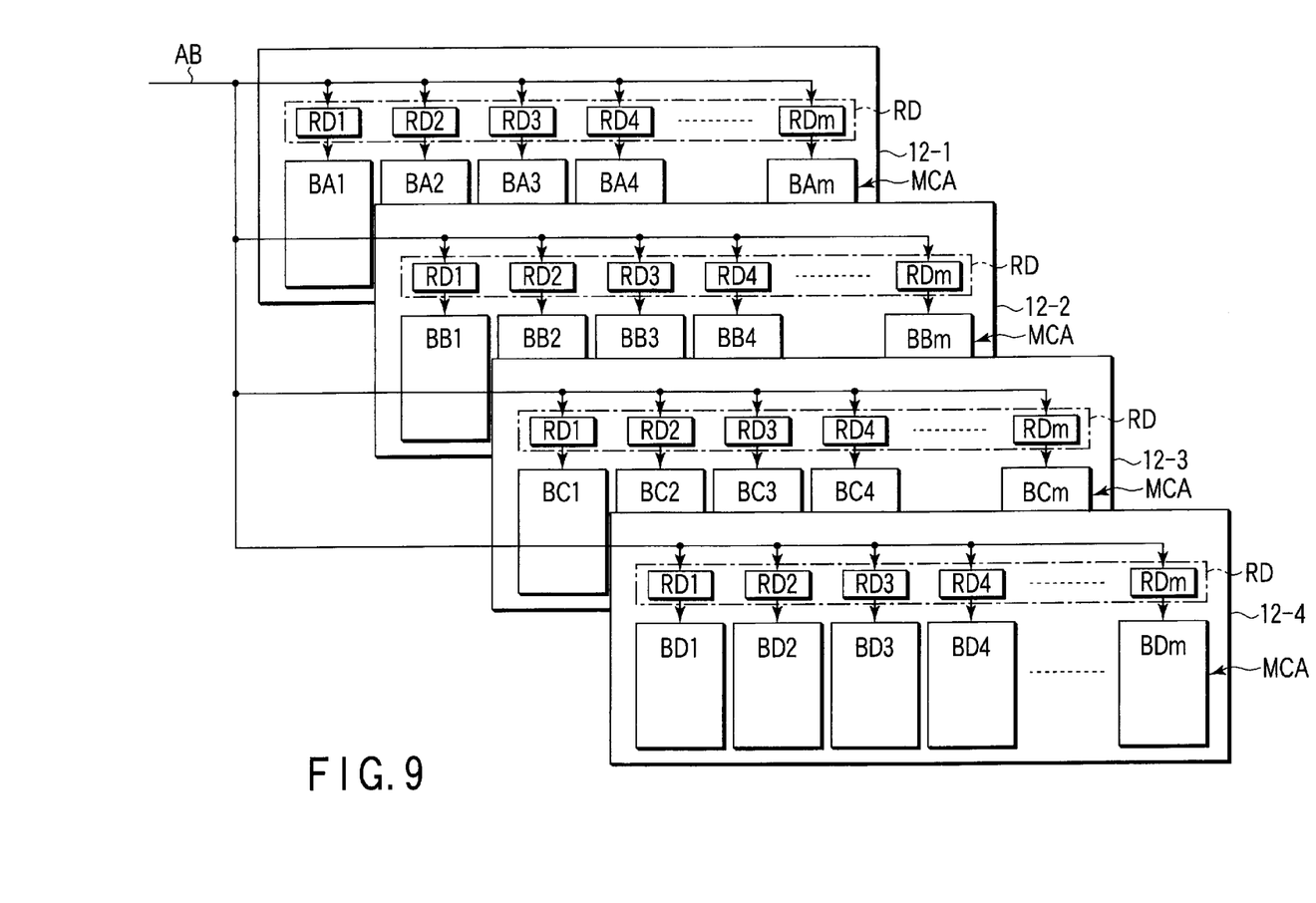
FIG. 9 is a block diagram schematically showing a case wherein four chips are stacked, for specifically illustrating an example of the redundancy process effected for a plurality of chips.

If the memory cell blocks BA4 to Bam of the chip 12-1 are defective in the construction shown in FIG. 9, the chip 12-1 cannot be compensated for by the normal redundancy technique because the number of defective blocks is excessively large and the chip must be discarded as defective. However, in this embodiment, addresses BB1 to BBm, BC1 to BCm, BD1 to BDm of all of the blocks including the redundancy blocks of the other chips 12-2 to 12-4 are assigned as the addresses of the defective blocks BA4 to BAm and thus the chip can compensate for said defect and be used as a multichip semiconductor device or memory card with a memory capacity of 1 to (3+m+m+m) blocks having the addresses BA1 to BA3, BB1 to BBm, BC1 to BCm and BD1 to BDm.

Since the chip which has a small operable memory capacity and is discarded as a defective chip can be utilized, the manufacturing yield can be increased.

In the second embodiment, a case wherein the four semiconductor memory chips are stacked is explained, but if the number of chips to be stacked is large, the idea can be applied to a chip instead of the memory cell block to perform the redundancy process. That is, spare chips are previously stacked, and if a defective chip is detected, the spare chip can be used instead of the defective chip. Particularly, with the increase in memory capacity of a semiconductor memory, the time required for testing becomes longer and thus the shipping of memories produced by only partial quality control is enabled. Alternatively, another test is further performed after the chips are mounted, and if a defective chip is detected, access to the defective chip is inhibited and the spare chip is activated. If the memory is shipped as it is, it is permissible for the user to select a spare chip instead of a defective chip.

As a method for changing the chip addresses, for example, a method for changing the wiring on the mounting board on which the chips are mounted, a method for forming a spare chip on the top layer of the chips to be stacked and changing the chip address according to whether a fuse provided in the spare chip is cut off or not, or a method for changing the chip address input via a chip address pin by use of an external input can be used.

Third Embodiment

Next, a multichip semiconductor device and memory card according to the third embodiment of this invention is explained with reference to FIGS. 10 to 12. In the first and second embodiments, a case wherein the stacked-stage number of the chip is specified according to whether the fuses are cut off or not is explained, but in the third embodiment, the chip address is sequentially increased by addition (or sequentially decreased by substruction) according to the stacked-stage number and the chip address is recognized so that the semiconductor memory chip itself can recognize the stacked-stage number thereof.

Figure 10:
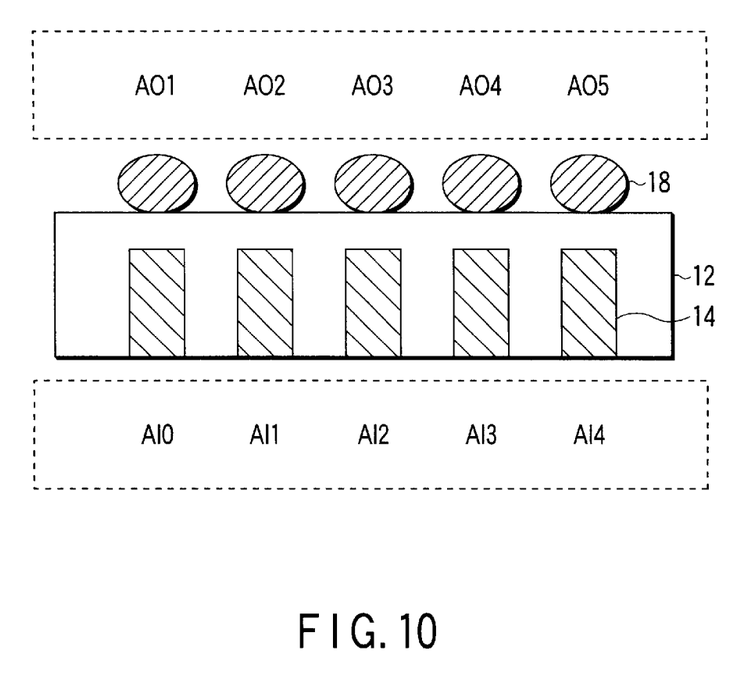
FIG. 10 is a schematic view for explaining the concept of a third embodiment and illustrating a multichip semiconductor device and memory card according to the third embodiment of this invention.

As shown in FIG. 10, chip addresses AI0 to AI4 input to a chip through plugs 14 of each semiconductor memory chip 12 are increased by addition in a stacked-stage number recognition circuit (a chip-identifying circuit) formed inside the chip 12 and then output as chip addresses AO0 to AO4 from solder bumps 18 to the next-stage chip.

The relation between the input chip addresses AI0 to AI4 and the output chip addresses AO0 to AO4 is set as indicated by the following equations by use of the binary notation.

AO0=AI0+1

AO1=AI1+AI0

AO2=AI2+AI1

AO3=AI3+AI2

AO4=AI4+AI3

In this case, since the output chip addresses AO0 to AO4 are changed each time the stacked-stage number increases, the signal is communicated into the chip 12 and recognized by the stacked-stage number recognition circuit. As a result, without using the fuse cutoff method, the stacked-stage number of the chip can be recognized by the chip itself.

In the chip 12 shown in FIG. 10, bumps and plugs for other signals are formed, but they are omitted in FIG. 10 for a simplified explanation.

Figure 11:
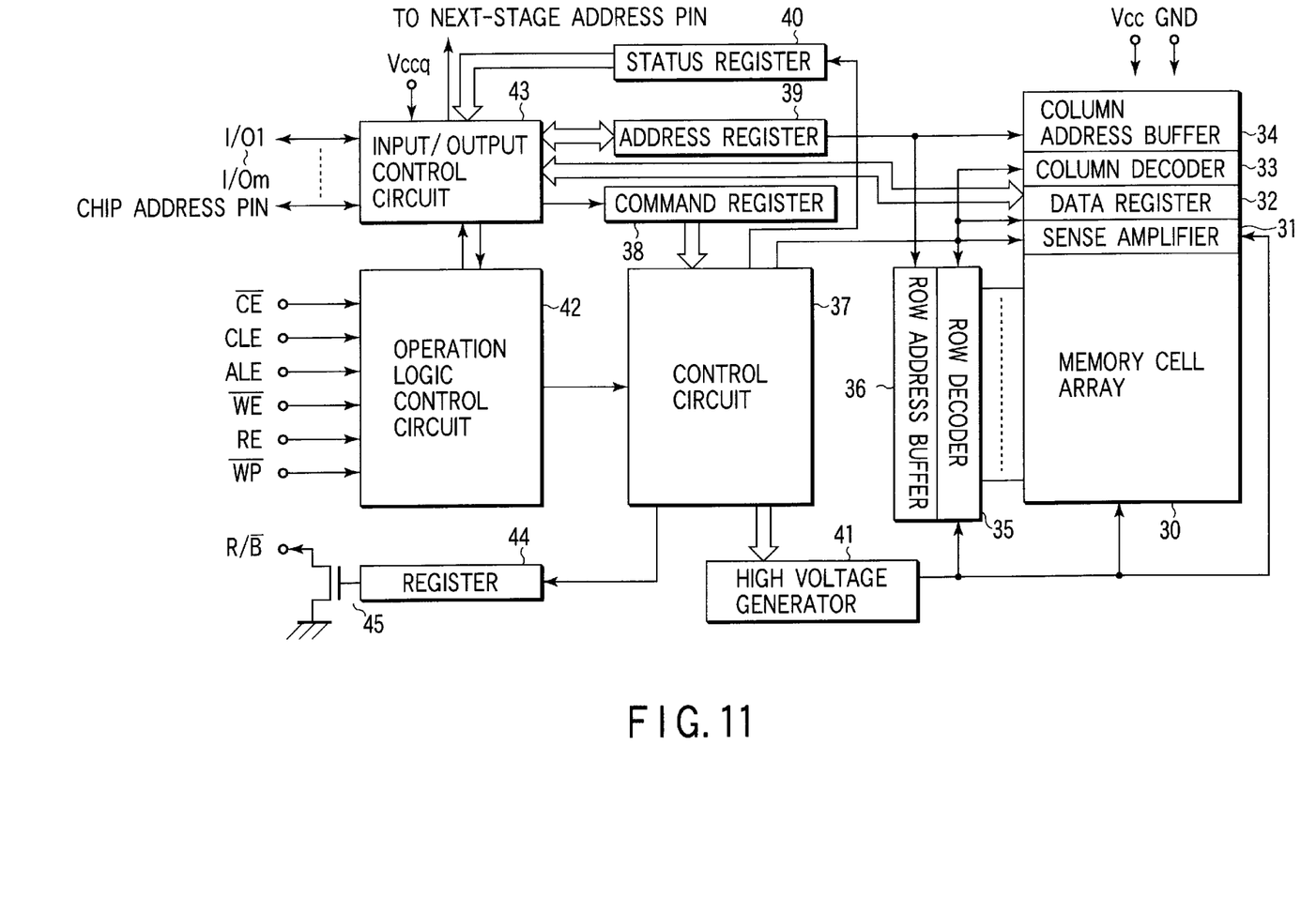
FIG. 11 is a block diagram showing the concrete circuit construction for realizing the adding operation of chip addresses and showing the schematic structure of an extracted main part of stacked $E^2$PROMs, for illustrating the multichip semiconductor device and memory card according to the third embodiment of this invention.
Figure 12:
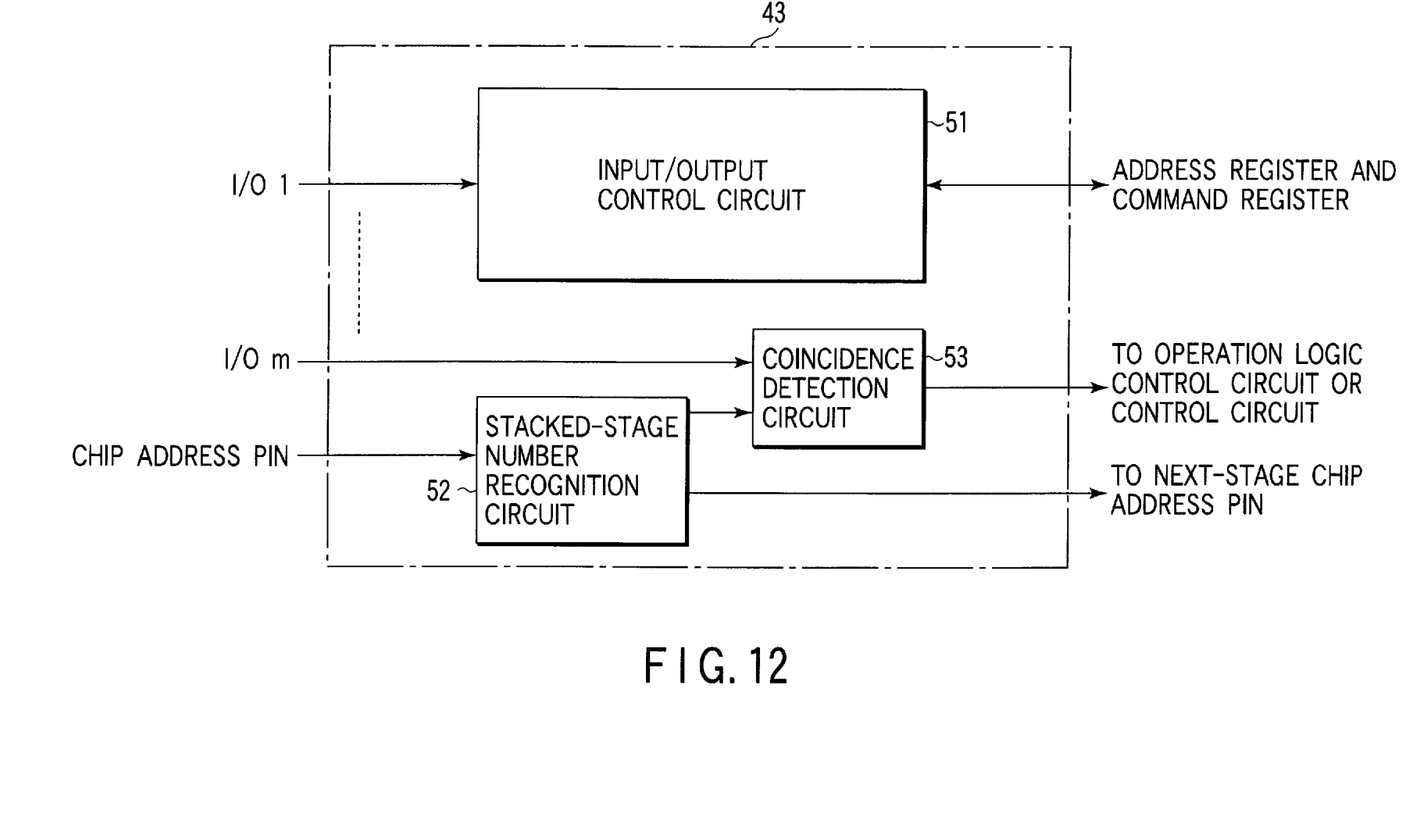
FIG. 12 is a block diagram showing an example of the concrete construction of an input/output control circuit of the circuit shown in FIG. 11.

FIGS. 11 and 12 illustrate the circuit construction for realizing the adding operation of the chip addresses as described above, FIG. 11 is a block diagram showing the schematic construction of an E$^2$PROM and FIG. 12 is a circuit diagram showing an example of the construction of an input/output control circuit in the circuit shown in FIG. 11.

The E$^2$PROM includes a memory cell array 30, sense amplifier 31, data register 32, column decoder 33, column address buffer 34, row decoder 35, row address buffer 36, control circuit 37, command register 38, address register 39, status register 40, high voltage generating circuit 41, operation logic control circuit 42, input/output control circuit 43 and register 44 for indicating the ready/busy state of the device.

The memory cell array 30 is divided into a plurality of blocks, and memory cells are arranged in a matrix form in each of the blocks. The row of the memory cells of the memory cell array 30 is selected by the row decoder 35 and the column of the memory cells is specified by the column decoder 33. Data of the memory cell selected by the row decoder 35 and column decoder 33 is supplied to, sensed, and amplified by the sense amplifier 31, then supplied to and latched by the data register 32 and read out from the data register 32 via the input/output control circuit 43.

On the other hand, write data input to the input/output control circuit 43 is supplied to and latched by the data register 32. Data latched by the data register 32 is written into a memory cell selected by the row decoder 35 and column decoder 33 via the sense amplifier 31.

An address signal is supplied to the row address buffer 36 and column address buffer 34 via the address register 39. Then, a row address supplied to the row address buffer 36 is supplied to and decoded by the row decoder 35 and a column address supplied to the column address buffer 34 is supplied to and decoded by the column decoder 33.

Various control signals (chip control signal $\overline{CE}$, command latch enable signal CLE, address latch enable signal ALE, write enable signal $\overline{WE}$, read enable signal RE, write protect signal $\overline{WP}$ and the like) are input to the operation logic control circuit 42 which in turn supplies control signals to the control circuit 37 and input/output control circuit 43.

An address signal, data and command are input to the input/output control circuit 43 via input/output pins I/O1 to I/Om and the address signal, data and command are respectively supplied to the address register 39, data register 32 and command register 38. Further, a chip address is supplied to the input/output control circuit 43 via the chip address pin and it recognizes the chip address so that the semiconductor memory chip can recognize its own stacked-stage number. Then, a signal obtained by subjecting the chip address to addition is supplied to the address pin of a next-stage (upper-stage) chip stacked thereon.

The command supplied to the command register 38 is supplied to the control circuit 37, which in turn controls the sense amplifier 31, data register 32, column decoder 33, row decoder 35, status register 40, high voltage generating circuit 41 and register 44 for indicating the ready/busy state of the device.

The status register 40 controls the input/output control circuit 43 based on the signal supplied from the control circuit 37.

The high voltage generating circuit 41 level-shifts (boosts) the power supply voltage and supplies a high voltage, for writing, to the row decoder 35, memory cell array 30 and sense amplifier 31.

Further, the register 44 indicates the ready/busy state of the chip based on the output signal of the control circuit 37, and a signal $\overline{R/B}$ is output by controlling the ON/OFF state of a transistor 45 based on data latched in the register 44.

FIG. 12 shows an example of the construction of the input/output control circuit 43 in the circuit shown in FIG. 11. The circuit 43 includes an input/output control circuit 51 which has the same circuit construction as in the conventional case, stacked-stage number recognition circuit 52 and coincidence detection circuit 53. The stacked-stage number recognition circuit 52 is constructed by a counting circuit, for example, and creates chip addresses AO0 to AO4 by increasing the chip addresses AI0 to AI4 input via the chip address pins by addition, and supplies them to the coincidence detection circuit 53 and next-stage chip address pin.

If coincidence between the chip addresses, input via the I/O pins, and the chip addresses created in the stacked-stage number recognition circuit 52 is detected in the coincidence detection circuit 53, an output signal of the coincidence detection circuit 53 is supplied to the operation logic control circuit 42 or control circuit 37 to set a corresponding one of the chips into an operable state.

That is, for example, in a case where the operation logic control circuit 42 is controlled by an output signal of the coincidence detection circuit 53, the operation for fetching various control signals into the operation logic control circuit 42 is inhibited and the corresponding chip is not operated if coincidence of the chip addresses is not detected by the coincidence detection circuit 53. Then, the operation for fetching various control signals into the operation logic control circuit 42 is performed and the corresponding operation is effected if coincidence of the chip addresses is detected by the coincidence detection circuit 53.

On the other hand, in a case where the control circuit 37 is controlled by an output signal of the coincidence detection circuit 53, the operations of the sense amplifier 31, data register 32, column decoder 33, row decoder 35, status register 40, high voltage generating circuit 41 and register 44, for indicating the ready/busy state of the device, which are controlled by the control circuit 37, are interrupted, and the corresponding chip is not substantially operated if coincidence of the chip addresses is not detected by the coincidence detection circuit 53. Then, if coincidence of the chip addresses is detected by the coincidence detection circuit 53, the operations of the sense amplifier 31, data register 32, column decoder 33, row decoder 35, status register 40, high voltage generating circuit 41 and register 44 are controlled by the control circuit 37, and normal operation is performed.

With the above construction, since the fuse cutoff method is not required for recognition of the stacked-stage number, a plurality of chips with the same structure can be stacked and a chip sorting operation for each stacked stage is not necessary, thus making the fuse cutoff process and chip sorting process unnecessary. As a result, the manufacturing process can be shortened, and an increase in the production efficiency and a further reduction in the manufacturing cost can be attained.

This invention is not limited to the first to third embodiments, and can be variously modified without departing from the technical scope thereof. For example, as the fuse used in the first and second embodiments, it is, of course, possible to use an anti-fuse or electric anti-fuse instead of a simple fuse. Further, in the third embodiment, a case wherein the relation between the input chip address and the output chip address is set in a binary-added relation is explained, but the method of addition is not necessarily used and a circuit for deriving a signal which is different for each stacked-stage number can be formed in the chip.

As described above, according to the embodiments of this invention, it is possible to provide a multichip semiconductor device and memory card in which an increase in the production efficiency and a further reduction in the manufacturing cost can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multichip semiconductor device having a plurality of semiconductor chips, each of said plurality of semiconductor chips comprising:

a semiconductor substrate having elements integrated therein;

connection plugs formed in through holes formed to penetrate through said semiconductor substrate; and fuse portions provided between said connection plugs and corresponding bump forming areas and being selectively cut off for selectively making and breaking electrical connections between said connection plugs and corresponding bumps;

wherein said plurality of semiconductor chips are stacked and mounted by connecting said connection plugs of said respective semiconductor chips via the bumps.

2. The multichip semiconductor device according to claim 1, wherein said connection plug includes a first insulating film formed on a side wall of the through hole formed in said semiconductor substrate, and a conductive through plug which is electrically isolated from said semiconductor substrate by means of said first insulating film, and said fuse portion includes a second insulating film formed on said semiconductor substrate, a pad which is formed on the second insulating film in a position corresponding to the connection plug, the bump being to be formed on the pad, a fuse formed in said second insulating film, and a wiring for electrically connecting said plug and through plug to each other via said fuse.

3. The multichip semiconductor device according to claim 1, wherein assignment of a chip address of each of said semiconductor chips is specified by selectively cutting off said fuse portions.

4. The multichip semiconductor device according to claim 1, wherein said connection plugs of at least (n−1) are formed on each of said semiconductor chips when the number of said semiconductor chips to be stacked is n (n is an integral number larger than 1) and said fuse portion is formed in each of said connection plugs.

5. The multichip semiconductor device according to claim 1, wherein first connection plugs of (n−1) and second connection plugs of n are formed on each of said semiconductor chips when the number of said semiconductor chips to be stacked is n (n is an integral number larger than 1) and said fuse portion is formed in each of said first connection plugs.

6. The multichip semiconductor device according to claim 5, further comprising optional circuits respectively provided in said plurality of semiconductor chips, for detecting a selected one of said semiconductor chips according to a selective cutoff state of said fuse portions and activating the selected semiconductor chip.

7. The multichip semiconductor device according to claim 6, wherein said optional circuit determines whether the semiconductor chip in which said optional circuit is formed is selected or not based on a signal supplied to said (n−1) first connection plugs according to a cutoff state of said fuse portions and first to n-th chip enable signals input via said n second connection plugs, and activates the semiconductor chip in which said optional circuit is formed when said optional circuit determines that the semiconductor chip in which said optional circuit is formed is selected.

8. The multichip semiconductor device according to claim 1, wherein each of said semiconductor chips is a nonvolatile memory chip.

9. The multichip semiconductor device according to claim 8, wherein said plurality of nonvolatile memory chips stacked and mounted commonly utilize memory cell blocks for redundancy.

10. The multichip semiconductor device according to claim 8, wherein assignment of memory addresses for said plurality of nonvolatile memory chips stacked and mounted is adjusted between said plurality of nonvolatile memory chips and assignment of memory addresses is made for a plurality of nonvolatile memory chips.

11. A memory card comprising:
a plurality of semiconductor memory chips with substantially the same structure, each including connection plugs formed in through holes formed to penetrate through a semiconductor substrate, and, fuse portions respectively provided between the connection plugs and corresponding bump forming areas and being selectively cut off for specifying assignment of an address;
bumps formed in substantially the same pattern, for connecting the connection plugs of said semiconductor memory chips;
a card-form package for sealing said plurality of semiconductor memory chips in a stacked form; and
terminals provided in said card-form package, for transferring signals with respect to said semiconductor memory chips via the connection plugs, fuse portions and bumps.

12. The memory card according to claim 11, wherein the connection plug includes a first insulating film formed on a side wall of the through hole formed in the semiconductor substrate and a conductive through plug which is electrically isolated from the semiconductor substrate by means of the first insulating film, and the fuse portion includes a second insulating film formed on the semiconductor substrate, a pad which is formed on the second insulating film in a position corresponding to the connection plug, the bump being to be formed on the pad, a fuse formed in said second insulating film, and wiring for electrically connecting the plug and through plug to each other via the fuse.

13. The memory card according to claim 11, wherein assignment of a chip address of each of said semiconductor memory chips is specified by selectively cutting off the fuse portions.

14. The memory card according to claim 11, wherein connection plugs of at least (n−1) are formed on each of said semiconductor memory chips when the number of said semiconductor memory chips to be stacked is n (n is an integral number larger than 1) and the fuse portion is formed in each of the connection plugs.

15. The memory card according to claim 11, wherein first connection plugs of (n−1) and second connection plugs of n are formed on each of said semiconductor memory chips when the number of said semiconductor memory chips to be stacked is n (n is an integral number larger than 1) and the fuse portion is formed in each of the first connection plugs.

16. The memory card according to claim 15, further comprising optional circuits respectively provided in said plurality of semiconductor memory chips, for detecting a selected one of said semiconductor memory chips according to a selective cutoff state of the fuse portions, and activating the selected semiconductor memory chip.

17. The memory card according to claim 16, wherein said optional circuit determines whether the semiconductor memory chip, in which said optional circuit is formed, is selected or not, based on a signal supplied to the (n−1) first connection plugs, according to the cutoff state of the fuse portions and first to n-th chip enable signals input via the n second connection plugs, and activates the semiconductor memory chip in which said optional circuit is formed, when said optional circuit determines that the semiconductor memory chip, in which said optional circuit is formed, is selected.

18. The memory card according to claim 11, wherein said plurality of semiconductor memory chips stacked and mounted, commonly utilize memory cell blocks for redundancy.

19. The memory card according to claim 11, wherein assignment of memory addresses for said plurality of semiconductor memory chips stacked and mounted is adjusted between said plurality of semiconductor memory chips, and assignment of a memory address is made for a plurality of semiconductor memory chips.

20. A multichip semiconductor device having a plurality of semiconductor chips stacked one upon another, each of which comprises:
a semiconductor substrate having elements integrated therein;
a chip through plug provided in the semiconductor substrate, for receiving a chip address; and
a chip-identifying circuit provided in the semiconductor substrate, for receiving the chip address from the chip through plug and determining from the chip address how many other chips are located below the semiconductor chip,
wherein the chip-identifying circuit of each semiconductor chip processes the chip address and then outputs the chip address to the chip-through plug of the immediately upper chip.

21. The multichip semiconductor device according to claim 20, further comprising a detection circuit for detecting that the chip address output from the chip-identifying circuit coincides with a chip address input from an I/O pin.

22. The multichip semiconductor device according to claim 21, wherein the detection circuit activates a semiconductor chip upon detecting that the chip address output from the chip-identifying circuit of the semiconductor chip coincides with the chip address input from an I/O pin.

23. The multichip semiconductor device according to claim 20, wherein the chip-identifying circuit of each semiconductor chip includes an adder circuit for adding an input chip addresses to another input chip address.

24. The multichip semiconductor device according to claim 20, wherein the chip-identifying circuit of each semiconductor chip includes a subtracter circuit for subtracting an input chip address from another input chip address.

25. The multichip semiconductor device according to claim 20, wherein each semiconductor chip is a memory chip.

* * * * *

UNITED STATES PATENT AND TRADEMARK OFFICE
CERTIFICATE OF CORRECTION

PATENT NO.    : 6,624,506 B2
DATED         : September 23, 2003
INVENTOR(S)   : Sasaki et al.

It is certified that error appears in the above-identified patent and that said Letters Patent is hereby corrected as shown below:

Title page,
Item [*] Notice, delete the phrase "by 58 days" and insert -- by 0 days --

Signed and Sealed this

Twelfth Day of October, 2004

JON W. DUDAS
*Director of the United States Patent and Trademark Office*